(12) United States Patent
Bouvigne et al.

(10) Patent No.: US 12,309,565 B2
(45) Date of Patent: May 20, 2025

(54) HEAT SINK VENT

(71) Applicant: SAGEMCOM BROADBAND SAS, Rueil Malmaison (FR)

(72) Inventors: Gabriel Bouvigne, Rueil Malmaison (FR); Charles-Efflam Martin De Montaudry, Rueil Malmaison (FR); Gilles Bourgoin, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 145 days.

(21) Appl. No.: 18/463,945

(22) Filed: Sep. 8, 2023

(65) Prior Publication Data

US 2024/0098421 A1    Mar. 21, 2024

(30) Foreign Application Priority Data

Sep. 8, 2022   (FR) ...................................... 2208968

(51) Int. Cl.
| | |
|---|---|
| *H04R 9/02* | (2006.01) |
| *H04N 21/426* | (2011.01) |
| *H04R 1/02* | (2006.01) |
| *H04R 1/28* | (2006.01) |
| *H05K 7/20* | (2006.01) |

(52) U.S. Cl.
CPC ........... *H04R 9/022* (2013.01); *H04N 21/426* (2013.01); *H04R 1/025* (2013.01); *H04R 1/028* (2013.01); *H04R 1/2826* (2013.01); *H05K 7/2039* (2013.01)

(58) Field of Classification Search
CPC ........ H04R 9/022; H04R 1/025; H04R 1/028; H04N 21/426; H05K 7/2039
USPC ......................................................... 381/332
See application file for complete search history.

(56) References Cited

U.S. PATENT DOCUMENTS

| | | | |
|---|---|---|---|
| 10,419,855 B2 * | 9/2019 | Hare ...................... | H04R 9/022 |
| 2006/0171556 A1 * | 8/2006 | Jabara .................... | H04R 9/022 381/397 |
| 2020/0314546 A1 | 10/2020 | Aleksandrov | |

FOREIGN PATENT DOCUMENTS

| | | | |
|---|---|---|---|
| FR | 2394220 A1 | | 1/1979 |
| FR | 3075546 A1 | | 6/2019 |
| JP | H10164680 A | | 6/1998 |
| JP | 2003061177 A | | 2/2003 |
| KR | 20190060180 A | * | 6/2019 |

* cited by examiner

*Primary Examiner* — Sean H Nguyen
(74) *Attorney, Agent, or Firm* — MUNCY, GEISSLER, OLDS & LOWE. P.C.

(57) ABSTRACT

Equipment includes a speaker enclosure comprising a chamber, a loudspeaker, and a vent; an electronic component; a heat sink device arranged to dissipate the heat generated by the electronic component and comprising both the vent and also a thermally conductive element that extends from an end of the vent and that is thermally coupled with the electronic component.

13 Claims, 3 Drawing Sheets

HEAT SINK VENT

The invention relates to the field of electrical equipment that includes a speaker enclosure.

BACKGROUND OF THE INVENTION

Numerous modern pieces of electrical equipment include a speaker enclosure comprising a loudspeaker in a chamber, together with various electronic components. Such electrical equipment includes, in particular, "enhanced" set-top boxes, smartspeakers, voice assistants, etc.

Such equipment is generally of very compact design, which means that all of its functions need to be incorporated in a small volume. In particular, the presence of the speaker chamber reduces the volume available for incorporating the electronic components of the various functions (speaker and other functions). The volume of air around the components is thus small, which impedes cooling of said electronic components and leads to major problems with diffusing heat.

The electric equipment thus incorporates devices specifically for diffusing and removing heat, such as radiators and heat sinks. The effectiveness of such devices is generally not sufficient, particularly since the volume available to them is also small. Using a fan appears to be problematic because of the space constraints and because of the potential disturbances generated in the audio signals played back by the speaker enclosure.

OBJECT OF THE INVENTION

An object of the invention is to improve heat dissipation in electrical equipment that includes a speaker enclosure.

SUMMARY OF THE INVENTION

In order to achieve this object, there is provided equipment comprising:
- a speaker enclosure comprising a chamber, a loudspeaker, and a vent;
- an electronic component;
- a heat sink device arranged to dissipate the heat generated by the electronic component and comprising both the vent and also a thermally conductive element that extends from an end of the vent and that is thermally coupled with the electronic component.

The tubular portion of the vent forms an extra heat dissipation surface in addition to that of the thermal conductor element. Furthermore, in operation, the surface of the vent is in contact with a flow of air that is considerable, thereby further improving the dissipation of the heat produced by the electronic component.

There is also provided equipment as described above, wherein the thermally conductive element comprises a plate lying in a plane perpendicular to the longitudinal axis of the vent, and wherein the vent flares at said end and opens out in said plate.

There is also provided equipment as described above, wherein the electronic component is mounted on a circuit card that lies between the plate and a face of the chamber, extending parallel to said plate and to said face.

There is also provided equipment as described above, wherein, when seen in section on a plane perpendicular to its longitudinal axis, the vent presents a shape that is oblong.

There is also provided equipment as described above, wherein the vent includes fins projecting from an inside surface of the vent and extending parallel to a longitudinal axis of the vent.

There is also provided equipment as described above, wherein two adjacent fins are spaced apart by a distance e such that:

$$e > 2*h$$

where h is the height of said fins.

There is also provided equipment as described above, wherein each fin is of a height that decreases on approaching the ends of the vent.

There is also provided equipment as described above, including a cable passage formed on or in a fin or between two adjacent fins, the cable passage extending along the length of said fin(s).

There is also provided equipment as described above, wherein the cable passage comprises a groove formed in a surface of a fin, which surface is remote from the inside surface of the vent from which said fin projects.

There is also provided equipment as described above, including a plurality of vents having respective longitudinal axes that are parallel.

There is also provided equipment as described above, wherein the plurality of vents includes at least two vents, each having a wall in contact with or coinciding with a wall of the other vent.

There is also provided equipment as described above, wherein the thermally conductive element comprises a plate forming an entire face of the chamber, or a portion thereof.

There is also provided equipment as described above, wherein the thermal coupling between the thermally conductive element and the electronic component is provided by thermal connection means positioned between the thermally conductive element and the electronic component.

There is also provided equipment as described above, the equipment being a set-top box.

The invention can better understood in the light of the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
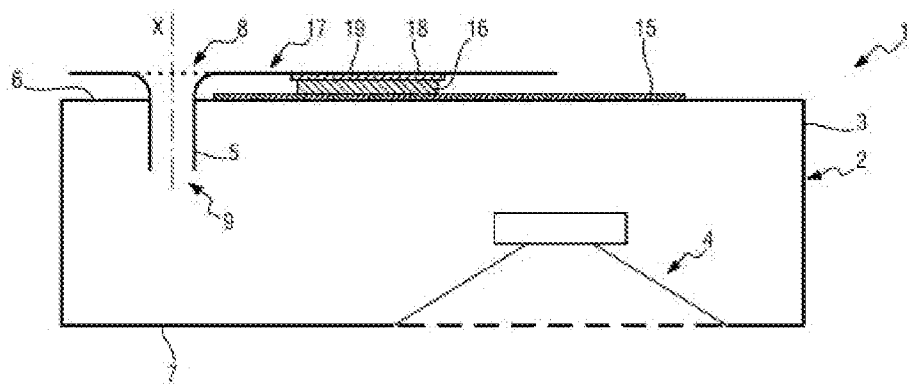
FIG. 1 shows electrical equipment of a particular embodiment in section view on a vertical plane.

With reference to FIG. 1, the invention is described as implemented in a set-top box (STB) 1. Specifically the STB 1 is an "enhanced" STB that includes not only the electronic components that enable it to perform the usual functions of an STB, but also a speaker enclosure 2 that enables it to play audio signals to the surroundings.

The speaker enclosure 2 comprises a chamber 3, a loudspeaker 4, and a vent 5. In this example, the loudspeaker 4 is a bass speaker (or "woofer") for reproducing low frequencies.

The vent 5 extends through the face 6 of the chamber 3 (top face) that is remote from its face 7 (bottom face) where the diaphragm of the loudspeaker 4 is located.

The longitudinal axis X of the vent 5 is perpendicular to the face 6 (and to the face 7).

The vent 5 has one end 8 situated outside the chamber 3, and another end 9 situated inside the chamber 3.

In general manner, the low-frequency performance of a speaker enclosure is improved by adding such a vent to the chamber. This is known as a "bass-reflex" type enclosure. The air flowing in the vent between the inside of the chamber and the outside forms a mechanical system that resonates at a specific frequency.

Figure 2:
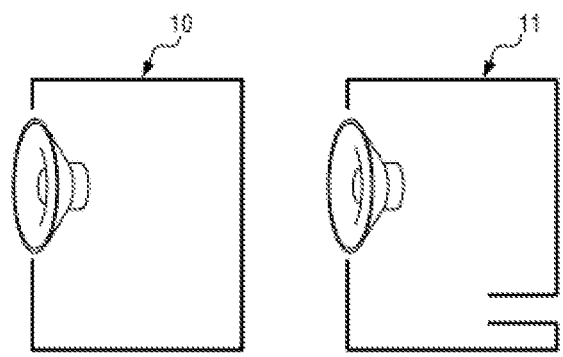
FIG. 2 shows a prior art speaker enclosure without a vent, and a prior art speaker enclosure with a vent.

In FIG. 2, there can be seen an enclosure 10 and an enclosure 11, both of which are prior art enclosures. The enclosure 10 is a closed enclosure, while the enclosure 11 includes a vent. The bass-reflex design improves the performance of the enclosure at low frequencies, without any need for an additional mechanical element (such as a passive radiator) and without requiring the diaphragm of the loudspeaker to be shifted too far (where any shifting of the diaphragm is constrained both by its mechanical characteristics and also by the external design of the equipment).

Figure 3:
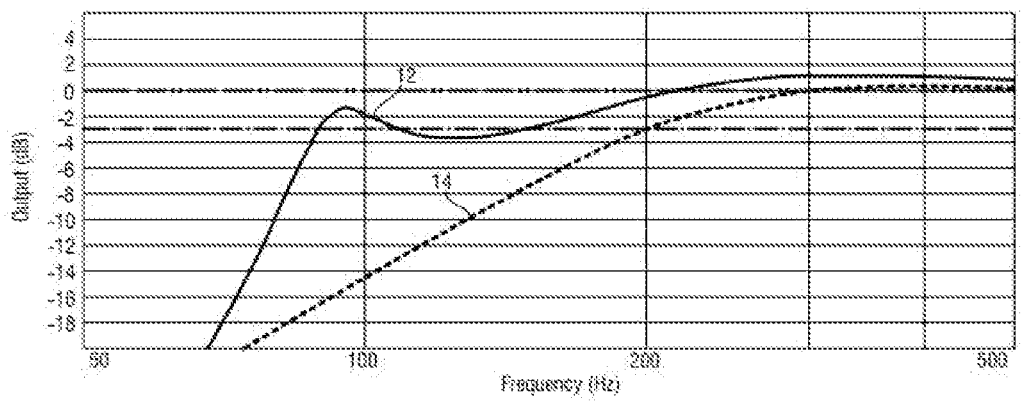
FIG. 3 shows the frequency responses of the FIG. 2 speaker enclosures.

With reference to FIG. 3, it can be seen that the response 12 of a speaker enclosure of bass-reflex design is increased at low frequencies in comparison with the response 14 of a "sealed" speaker enclosure, i.e. a speaker enclosure without a vent and having a volume that is closed.

The increased response at low frequencies is due to the tubular shape of the vent, which, since it is coupled to the inside volume of the enclosure, acts as a Helmholtz resonator. The resonant frequency of this system is given by the following formula:

$$f_{BassReflex} = \frac{c}{2\pi}\sqrt{\frac{S}{(L+K\sqrt{S}) \cdot V}}$$

where c is the speed of sound in air (c=340 m·s$^{-1}$), L is the length of the vent (along its longitudinal axis X), V is the volume of the chamber of the speaker enclosure, K is an end correction coefficient, and S is the section of the vent (i.e. its cross-sectional area). In the common circumstance of a vent that is circular in section, its section is equal to the area of the circle, i.e. S=π·r$^2$, where r is the radius of the circle.

Returning to the invention and to FIG. 1, the STB 1 also includes one or more circuit cards on which electronic components are mounted. These circuit cards include a card 15 that is mounted outside the chamber 3, being positioned parallel to the face 6 and against the outside surface of said face 6. The card 15 is fastened to the face 6. In particular, the card 15 includes an electronic component 16 that is a component that heats up quite considerably while in operation. It may be a component of any type and for example it may be a system on a chip (SoC), a processor, a radio transmitter, an amplifier, etc.

The STB 1 also includes a heat sink device 17 for improving heat dissipation by the STB 1, and in particular for dissipating the heat generated by the component 16 while it is in operation.

The heat sink device 17 comprises both the vent 5 and also a thermally conductive element that extends from the end 8 of the vent 5 and that is thermally coupled with the electronic component 16.

In this example the thermally conductive element is a rectangular plate 18 that extends in a plane perpendicular to the longitudinal axis X of the vent 5. The vent 5 flares at its end 8 so as to open out in said plate 18. In this example, the vent 5 and the plate 18 form a single piece (but that is not essential).

This piece is made out of one or more rigid materials, e.g. such as aluminum or a plastics material of acrylonitrile butadiene styrene (ABS) type, so that the section of the vent 5 remains constant in spite of pressure variations, and so as to obtain good conduction of heat.

The plate 18 extends outside the chamber 3 parallel to the face 6 of the chamber 3. The circuit card 15 and the electronic component 16 are located between the thermally conductive plate 18 and the face 6 of the chamber 3. The plate 18 extends over the majority of the area of the face 6 of the chamber 3, and in particular it covers all of the area of the component 16.

The heat sink device 17 further comprises thermal connection means between the surface of the component 16 and the plate 18 for coupling them together thermally.

In this example, the thermal connection means comprise a thermal pad 19 placed between the electronic component 16 the thermal plate 18 so as to be in contact with both of these elements.

The heat sink device 17 thus enables the heat generated by the electronic component 16 to be dissipated.

The vent 5 is used as a heat-dissipation surface. While the loudspeaker 4 is in operation, this surface is in direct contact with a flow of air that is considerable, in one direction or the other: air is moved at high speed in the vent 5 while sound is being played.

The shape of the vent 5 is designed to maximize contact area with that air.

Figure 4:
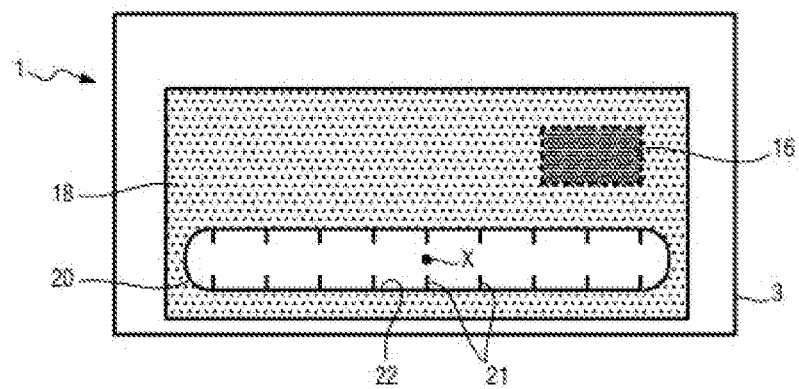
FIG. 4 is a plan view from above showing the chamber and the heat sink device.

With reference to FIG. 4, the vent 5 is in the shape of a cylinder of oblong section: when seen in section on a plane perpendicular to its longitudinal axis X, the vent 5 presents a shape that is oblong.

Thus, the outline 20 of the vent 5 is in the shape of a rectangle with short sides that are rounded and with long sides that are parallel to the length of the STB 1.

Giving the vent 5 a section of a shape that is elongate, instead of being circular, enables the diameter of the vent 5 to be reduced in its short dimension (the "width" of the vent 5), thereby reducing the depth of the STB 1, while increasing the area of the vent 5 in contact with air for a given volume of air (for given cross-sectional area, the perimeter of the vent 5 is increased). This elongate shape thus enables heat exchange to be improved while reducing the overall size of the STB 1.

Furthermore, the periphery of the vent 5 is provided with fins 21. The fins 21 project from the inside surface 22 of the vent 5, and they extend parallel to its longitudinal axis X. The fins 21 enable the area of contact with air to be increased further.

The reduction in the effective section of the vent 5 caused by the presence of the fins 21 needs to be compensated by an increase in its dimensions (compared with a vent 5 having no fins). The new resonant frequency $f_{event}$ of the heat-dissipating vent is then given by:

$$f_{vent} = \frac{c}{2\pi}\sqrt{\frac{S_{effective}}{(L + K\sqrt{S_{effective}}) \cdot V}}$$

where $S_{effective} = S - S_{fin} \cdot N_{fin}$ with $S_{fin}$ being the cross-sectional area of a fin 21, and with $N_{fin}$ being the number of fins 21 incorporated in the vent 5.

The amount by which the dimensions of the vent 5 need to be increased is relatively small, since the presence of the fins 21 has little influence on the section of the vent 5. Nevertheless, the fins 21 enable a large increase to be obtained in the perimeter of the vent 5, and thus in the area of heat exchange between the heat sink device 17 and air. Nevertheless, in order to maximize the heat power extracted from the vent 5, it is essential for air to flow properly between the fins 21: the speed profile of the air flow must be as uniform as possible within the section of the vent 5, both going in and going out. Also, if air does not flow properly between the fins 21, the effective section of the vent 5 is reduced and the bass-reflex resonant frequency no longer matches the frequency calculated for the speaker enclosure 2.

Figure 5:
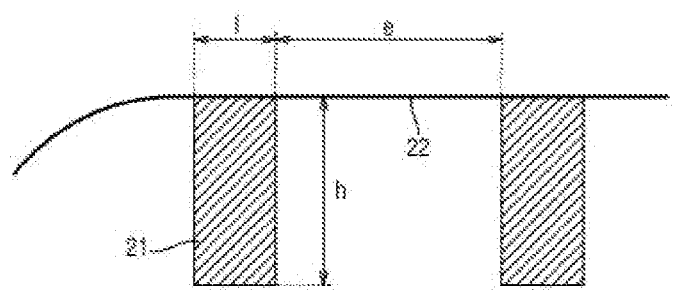
FIG. 5 shows a portion of the vent in section view on a plane perpendicular to the longitudinal axis of the vent.

Thus, with reference to FIG. 5, in order to minimize the influence of the fins 21 on air flow, their dimensions and positions must be selected so that the distance e between two adjacent fins 21 is greater than the height h of said fins 21.

Advantageously, this gives: e>2*h.

The width l of each fin 21 should preferably be selected to be as small as possible, even though it has very little influence on the increase in the perimeter of the vent 5. These criteria also serve to avoid acoustic disturbances when air is flowing at high speed between two fins 21 (where such disturbances can generate whistling noises).

Furthermore, it is preferable not to have sharp edges at the inlet and the outlet of the vent, since sharp edges give rise to turbulence in the flow of the air stream.

Figure 6:
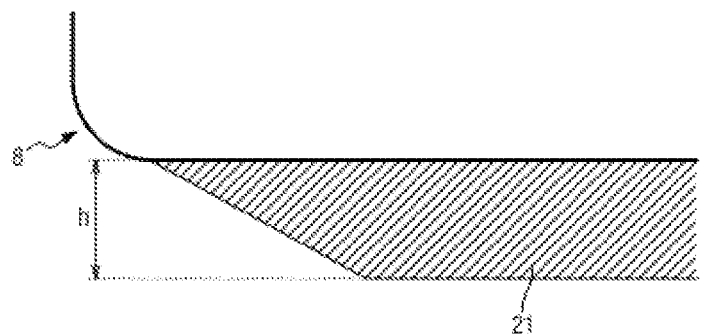
FIG. 6 shows a fin and an end of the vent in section view on a plane containing the longitudinal axis of the vent.

With reference to FIG. 6, the height h of the fins 21 decreases on approaching each of the ends 8 and 9 of the vent 5. Along its length, each fin 21 has a central portion of constant height, and two end portions of height that decreases on going towards the corresponding end of the fin (and thus of the vent).

Thus, when seen in section view on a plane containing the longitudinal axis X of the vent 5, each end of the fin 21 has the shape of a slope going down towards the closer end of the vent 5. Each fin 21 is thus shaped and tapers at the inlet and at the outlet of the vent 5, thereby serving to avoid turbulence. The resulting chamfer serves to avoid the fin 21 acting as an obstacle to the flow of air.

Figure 7:
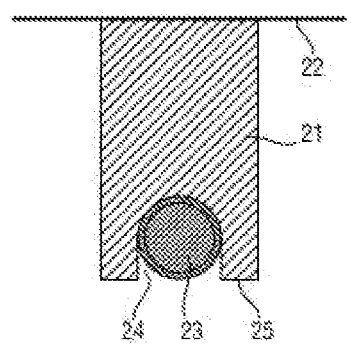
FIG. 7 shows a fin and a cable in section view on a plane perpendicular to a longitudinal axis of said fin.

With reference to FIG. 7, at least one of the fins 21 has a cable passage running along the length of said fin 21 and serving to receive a cable 23 (which could be merely one wire). Specifically, each of a plurality of fins 21 includes a respective cable passage.

By way of example, the cables 23 connect the loudspeaker 4 to an amplifier located outside the chamber 3.

However, that is not essential: the cable(s) 23 could perfectly well connect together components other than a loudspeaker and an amplifier.

Specifically, each cable passage comprises a groove 24 formed in the projecting surface 25 of the fin, i.e. the surface remote from the inside surface 22 of the vent 5 from which said fin projects.

The groove 24 enables the cable 23 to be inserted therein along the entire length of the vent 5. The groove 24 holds the cable 23 by pinching. This makes it possible to pass the cable 23 via the vent 5, so as to avoid forming a passage for the cable 23 through the wall of the chamber, and thus avoid sealing problems.

The cable 23, regardless of whether it is smooth or rough, must be sufficiently flexible to be embedded in the groove 24 and be held there by force. The above-mentioned material of the vent 5 serves to ensure that the fin 21 is strong enough to hold the cable without deforming. Finally, the extension of the heat sink device 17 at the outlet of the vent 5 can be used to guide the cable 23 to the component situated outside the chamber 3 and to which it is connected.

In this example, the groove 24 narrows at its outlet (and possibly at its inlet), so as to avoid any risk of the cable 23 "popping out" during normal use of the equipment.

It should be observed that with the cable 23 received in the groove 24, the "solid" section of the fin 21 in a plane perpendicular to the longitudinal axis of the fin 21, i.e. the sum of the area of the section of the fin 21 plus the area of the section of the cable 23, is almost equal to the area of the section that the fin 21 would have without the groove 24. Thus, having the groove 24 and the cable 23 present does not alter the above-specified formula for the resonant frequency of the vent 5, thereby making the heat sink device 17 easier to design.

Numerous variants are possible.

Figure 8:
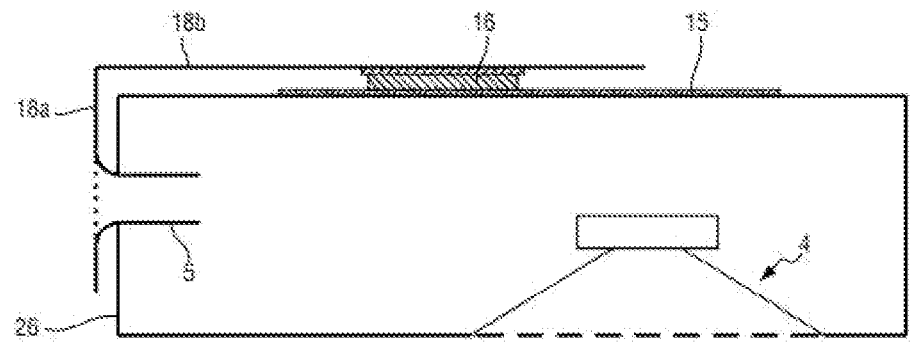
FIG. 8 shows electrical equipment of another particular embodiment in section view on a vertical plane.

With reference to FIG. 8, the vent 5 could extend through a different face of the chamber 3, and for example through its rear face 26.

The component 16 for cooling and the circuit card 15 on which it is mounted could still be situated on top of the chamber 3. Under such circumstances, the external portion of the vent 5 is extended by a first plate 18a and then by a second plate 18b perpendicular to the first plate 18a, with the second plate 18b completely covering the surface of the component 16. The first and second plates 18a and 18b (and also the vent 5) can be formed as a single piece, but that is not essential.

The plate(s) 18 could constitute portions of one or more faces of the chamber 3, or could constitute the face(s) entirely.

In another variant, the height of the fins 21 could equally well be increased so as to have a plurality of pipes for which the sum of the sections is equal to the section of the initial vent.

Figure 9:
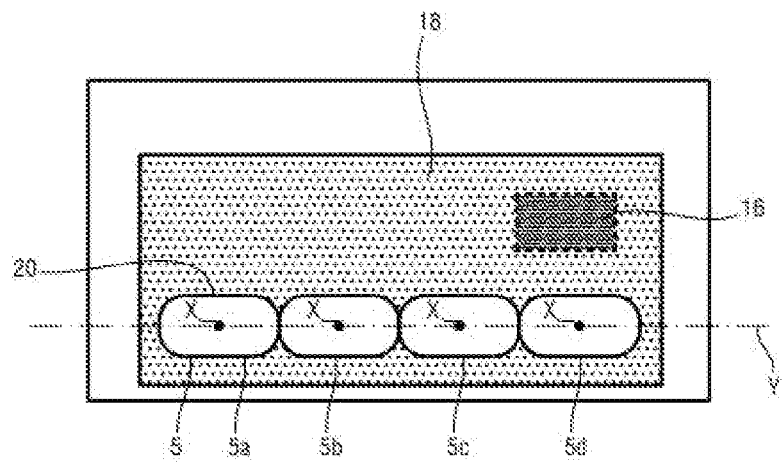
FIG. 9 is a plan view from above showing the chamber and the heat sink device in another embodiment.

With reference to FIG. 9, the speaker enclosure 2 thus has a plurality of vents.

The vents may be "touching" (e.g. via one of their walls), or they may be non-touching.

In this example, the speaker enclosure has four vents 5a, 5b, 5c, and 5d. The longitudinal axes X of the vents 5 are parallel to one another and perpendicular to the plane in which the plate 18 extends.

As above, the section of each vent 5 in a plane perpendicular to its longitudinal axis X is oblong. The outline 20 of each vent 5 is in the shape of a rectangle with short sides that are rounded and with long sides that are parallel to the length of the STB 1.

The vents are aligned and they extend in succession so that the long axes Y of their outlines 20 are in alignment and parallel to the length of the STB 1.

The vents are positioned so that the outside surfaces of two adjacent vents are in contact via the widths of their outlines 20: the vent 5a is in contact with the vent 5b, which is also in contact with the vent 5c, which is also in contact with the vent 5d.

These surfaces, which may coincide where they make contact, act as the above-described fins.

This configuration serves to maximize heat exchange areas with air. This variant may be used when providing fins 21 is too complex, e.g. if the material is too flexible or if it is not possible to machine fins.

Naturally, the invention is not limited to the embodiments described, but covers any variant coming within the ambit of the invention as defined by the claims.

The electrical equipment in which the invention is implemented need not necessarily be an STB, but could be any equipment including a speaker enclosure and electronic components: smartspeaker; voice assistant; TV set; etc.

Naturally, the heat sink plate 18 could be thermally coupled with a plurality of electronic components.

The plate could optionally be provided with ribs/fins in order to increase its dissipation area.

The plate and the component for cooling could be situated inside the chamber; the plate would then extend from the end 9 of the vent 5.

The heat sink device could have two plates, each extending from a respective end of the vent: one plate located outside the chamber and another inside the chamber, each plate being thermally coupled with at least one electronic component.

The thermally conductive element extending from an end of the vent need not necessarily be in the shape of a plate, but could be of any shape.

The vent and the thermally conductive element may be designed as a plurality of distinct pieces that are connected together by a suitable thermally conductive connection (direct contact or via thermal connection means, e.g. a thermal pad). It is then possible for these two pieces to be made out of materials that are different, e.g. such as aluminum or copper for the dissipater and ABS plastic material for the vent. This enables overall manufacturing cost to be reduced compared with an all-metal device (ABS is easier to machine for complex shapes).

The thermal means for coupling the component for cooling thermally with the thermally conductive element need not necessarily be a pad: by way of example said means could be thermal paste or even a thermally conductive epoxy resin.

The cable passage associated with a fin need not necessarily be a groove. By way of example it could be a tubular duct formed inside the fin, or else fastener means such as hooks positioned on a face of the fin.

The cable passage is not necessarily associated with a single fin. The cable passage may be formed on or in a single fin, or else between two adjacent fins, the cable passage extending along the length of said fin(s). By way of example, the cable passage could be constituted by two fins that are close together so that the cable can be pinched between those two fins. The faces of those fins that face the inserted cable may optionally be ribbed so as to assist in holding the cable in place.

The invention claimed is:

1. Equipment, comprising:
   a speaker enclosure comprising a chamber, a loudspeaker, and a vent;
   an electronic component; and
   a heat sink device arranged to dissipate the heat generated by the electronic component and comprising both the vent and also a thermally conductive element that extends from an end of the vent and that is thermally coupled with the electronic component, the vent comprising fins projecting from an inside surface of the vent and extending parallel to a longitudinal axis of the vent, the equipment being characterized in that it comprises a cable passage formed on or in a fin or between two adjacent fins, the cable passage extending along the length of said fin(s).

2. The equipment according to claim 1, wherein the thermally conductive element comprises a plate lying in a plane perpendicular to the longitudinal axis of the vent, and wherein the vent flares at said end and opens out in said plate.

3. The equipment according to claim 2, wherein the electronic component is mounted on a circuit card that lies between the plate and a face of the chamber, extending parallel to said plate and to said face.

4. The equipment according to claim 1, wherein when seen in section on a plane perpendicular to its longitudinal axis, the vent presents a shape that is oblong.

5. The equipment according to claim 1, wherein two adjacent fins are spaced apart by a distance e such that:

$$e > 2*h$$

where h is a height of said fins.

6. The equipment according to claim 1, wherein each fin is of a height that decreases on approaching the ends of the vent.

7. The equipment according to claim 1, wherein the cable passage comprises a groove formed in a surface of a fin, which surface is remote from the inside surface of the vent from which said fin projects.

8. The equipment according to claim 7, wherein the cable is inserted in the groove along the entire length of the vent, the groove holding the cable by pinching.

9. The equipment according to claim 1, including a plurality of vents having respective longitudinal axes that are parallel.

10. The equipment according to claim 9, wherein the plurality of vents includes at least two vents, each having a wall in contact with or coinciding with a wall of the other vent.

11. The equipment according to claim 1, wherein the thermally conductive element comprises a plate forming an entire face of the chamber, or a portion thereof.

12. The equipment according to claim 1, wherein the thermal coupling between the thermally conductive element and the electronic component is provided by thermal connection means positioned between the thermally conductive element and the electronic component.

13. The equipment according to claim 1, he equipment being a set-top.

* * * * *